US010893617B2

United States Patent
Ariumi

(10) Patent No.: US 10,893,617 B2
(45) Date of Patent: Jan. 12, 2021

(54) MULTILAYER SUBSTRATE AND ANTENNA MODULE

(71) Applicant: Murata Manufacturing Co., Ltd., Kyoto (JP)

(72) Inventor: Saneaki Ariumi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/799,996

(22) Filed: Feb. 25, 2020

(65) Prior Publication Data

US 2020/0337157 A1 Oct. 22, 2020

Related U.S. Application Data

(63) Continuation of application No. PCT/JP2018/029610, filed on Aug. 7, 2018.

(30) Foreign Application Priority Data

Aug. 30, 2017 (JP) ................. 2017-165130

(51) Int. Cl.
*H05K 3/46* (2006.01)
*H01Q 13/08* (2006.01)
*H01Q 21/06* (2006.01)
*H01Q 9/04* (2006.01)
*H05K 3/40* (2006.01)
*H01Q 1/38* (2006.01)
(Continued)

(52) U.S. Cl.
CPC ............ *H05K 3/46* (2013.01); *H01Q 1/38* (2013.01); *H01Q 9/0407* (2013.01);
(Continued)

(58) Field of Classification Search
CPC .. H05K 3/46; H05K 1/16; H05K 1/02; H05K 3/40
(Continued)

(56) References Cited

U.S. PATENT DOCUMENTS

2008/0136013 A1\* 6/2008 Kamiya ................ H05K 1/186 257/700
2012/0205145 A1\* 8/2012 Sakai ................ H05K 3/4632 174/255
(Continued)

FOREIGN PATENT DOCUMENTS

JP 2005-026406 A 1/2005
JP 2005-072328 A 3/2005
(Continued)

OTHER PUBLICATIONS

International Search Report for International Application No. PCT/JP2018/029610, dated Oct. 23, 2018.
(Continued)

*Primary Examiner* — Sherman Ng
(74) *Attorney, Agent, or Firm* — Pearne & Gordon LLP

(57) ABSTRACT

A multilayer substrate includes a plurality of insulator layers laminated, a column conductor extending through two or more insulator layers among the plurality of insulator layers. The column conductor includes a first via conductor extending through a first insulator layer and a second via conductor extending through a second insulator layer adjacent to the first insulator layer. Each of the first via conductor and the second via conductor has a tapered shape in which a cross section decreases from one end portion to the other end portion in the lamination direction of the plurality of insulator layers. The first via conductor and the second via conductor are directly bonded to each other at large diameter portions that are end portions with a large cross section or small diameter portions that are end portions with a small cross section.

9 Claims, 15 Drawing Sheets

(51) Int. Cl.
  *H05K 1/02*    (2006.01)
  *H05K 1/16*    (2006.01)
  *H01Q 23/00*   (2006.01)

(52) U.S. Cl.
  CPC ............ *H01Q 13/08* (2013.01); *H01Q 21/06* (2013.01); *H01Q 23/00* (2013.01); *H05K 1/02* (2013.01); *H05K 1/16* (2013.01); *H05K 3/40* (2013.01)

(58) Field of Classification Search
  USPC ........................................................ 174/262
  See application file for complete search history.

(56) References Cited

U.S. PATENT DOCUMENTS

| 2014/0034365 A1* | 2/2014 | Otsubo | H05K 1/0313 |
| | | | 174/254 |
| 2015/0257281 A1* | 9/2015 | Kao | H01L 23/49827 |
| | | | 174/262 |

FOREIGN PATENT DOCUMENTS

| JP | 2009-111658 A | 5/2009 |
| JP | 2010-098274 A | 4/2010 |
| JP | 2012-094662 A | 5/2012 |

OTHER PUBLICATIONS

Written Opinion for International Application No. PCT/JP2018/029610, dated dated Oct. 23, 2018.

\* cited by examiner

US 10,893,617 B2

MULTILAYER SUBSTRATE AND ANTENNA MODULE

This is a continuation of International Application No. PCT/JP2018/029610 filed on Aug. 7, 2018 which claims priority from Japanese Patent Application No. 2017-165130 filed on Aug. 30, 2017. The contents of these applications are incorporated herein by reference in their entireties.

BACKGROUND

Technical Field

The present disclosure relates to a multilayer substrate and an antenna module.

A multilayer wiring substrate (multilayer substrate), in which a connection pad for connecting to an electronic element is provided on a front surface and a terminal pad for connecting to an external circuit is provided on a back surface, having a configuration with a tapered via conductor is disclosed (for example, refer to Patent Document 1). According to this configuration, the diameter of the via conductor connected to the terminal pad on the back surface is gradually reduced from the back surface side to the front surface side, and on the other hand, the diameter of other via conductors is gradually decreased from the front surface side to the back surface side, whereby connection resistance between the via conductors can be reduced.

Patent Document 1: Japanese Unexamined Patent Application Publication No. 2005-072328

BRIEF SUMMARY

When a multilayer substrate is applied to, for example, a radio frequency application, it is important to reduce loss associated with a column conductor formed of a via conductor. However, in the configuration of the related art described above, the loss relating to the column conductor is not examined since ensuring connection reliability between the via conductor and the connection pad, ensuring connection reliability between the via conductor and the terminal pad, and reducing connection resistance between the via conductors or the like are priority issues.

The present disclosure reduces loss associated with the column conductor in the multilayer substrate and an antenna module.

A multilayer substrate according to an embodiment of the present disclosure includes a plurality of insulator layers laminated, and a column conductor extending through two or more of the plurality of insulator layers. The column conductor has a first via conductor extending through a first insulator layer and a second via conductor extending through a second insulator layer adjacent to the first insulator layer. Each of the first via conductor and the second via conductor has a tapered shape in which a cross section decreases from one end portion to another end portion in a lamination direction of the plurality of insulator layers. The first via conductor and the second via conductor are directly bonded to each other at large diameter portions that are end portions with a large cross section or small diameter portions that are end portions with a small cross section.

In this manner, each of the first via conductor and the second via conductor has the tapered shape in which the cross section decreases from one end portion to the other end portion in the lamination direction of the plurality of insulator layers. The large diameter portions are directly bonded to each other or the small diameter portions are directly bonded to each other with respect to the first via conductor and the second via conductor, whereby the step formed between the first via conductor and the second via conductor, which is a factor of loss in the column conductor, can be reduced. Thus, it is possible to suppress loss in the column conductor.

The multilayer circuit board according to another aspect of the present disclosure includes a plurality of insulator layers laminated, and a column conductor extending through two or more of the plurality of insulator layers. The column conductor has a first via conductor extending through a first insulator layer, a second via conductor extending through a second insulator layer adjacent to the first insulator layer, and an electrode pad which is disposed between the first insulator layer and the second insulator layer. One main surface of the electrode pad is bonded to the first via conductor and the other main surface thereof is bonded to the second via conductor. Each of the first via conductor and the second via conductor has a tapered shape in which a cross section decreases from one end portion to another end portion in the lamination direction of the plurality of insulator layers. The first via conductor and the second via conductor are bonded, with the electrode pad interposed in between, to each other at large diameter portions that are end portions with a large cross section or small diameter portions that are end portions with a small cross section. The electrode pad has a shape to be disposed in at least one of the large diameter portion of the first via conductor and the large diameter portion of the second via conductor when viewed in the lamination direction.

As described above, each of the first via conductor and the second via conductor has the tapered shape in which a cross section decreases from one end portion to the other end portion in the lamination direction of the plurality of insulator layers. The large diameter portions that are end portions with a large cross section are bonded to each other or the small diameter portions that are end portions with a small cross section are bonded to each other, with an electrode pad interposed therebetween with respect to the first via conductor and the second via conductor. With respect to the first via conductor and the second via conductor, the large diameter portions are bonded to each other or the small diameter portions are bonded to each other, with the electrode pad having the shape stated above interposed therebetween, whereby the step formed between the first via conductor and the second via conductor, which is a factor of loss in the column conductor, can be reduced. Thus, it is possible to suppress loss in the column conductor.

In addition, the first via conductor and the second via conductor may be bonded to each other at the small diameter portions, and when viewed in the lamination direction, the electrode pad may have a shape to be disposed in at least one of the small diameter portion of the first via conductor and the small diameter portion of the second via conductor.

Since the small diameter portions of the first via conductor and the second via conductor are bonded to each other with the electrode pad interposed therebetween, a protruding portion that causes loss, at a portion where the small diameter portions are bonded to each other, is not easily formed. Thus, loss can be further reduced in the column conductor in which the small diameter portions of the first via conductor and the second via conductor are bonded to each other with the electrode pad interposed therebetween.

In addition, the first via conductor and the second via conductor may be bonded to each other at the large diameter portions, the multilayer substrate may further include a pattern conductor connected to the small diameter portion of the first via conductor or the small diameter portion of the second via conductor, and a width of the pattern conductor may be smaller than a diameter of one, to which the pattern conductor is connected, of the large diameter portion of the first via conductor and the large diameter portion of the second via conductor.

It is possible to suppress loss occurring in the connection portion between the pattern conductor and the column conductor in a relatively high frequency band of higher than or equal to 33.13 GHz, in addition to loss in the column conductor by making the width of the pattern conductor smaller than the diameter of the large diameter portion in the column conductor in which the large diameter portions of the first via conductor and the second via conductor are bonded to each other. Thus, when the frequency band to be used is higher than or equal to 33.13 GHz, it is possible to suppress loss in a transmission line formed of the column conductor and the pattern conductor connected thereto.

In addition, the width of the pattern conductor may be smaller than or equal to a diameter of one, to which the pattern conductor is connected, of the small diameter portion of the first via conductor and the small diameter portion of the second via conductor.

It is possible to suppress loss occurring in the connection portion between the pattern conductor and the column conductor even in a relatively low frequency band of lower than 33.13 GHz by making the width of the pattern conductor to be smaller than or equal to the diameter of the small diameter portion in the column conductor in which the large diameter portions of the first via conductor and the second via conductor are bonded to each other. Thus, loss in a transmission line formed of the column conductor and the pattern conductor connected thereto can be suppressed regardless of the frequency band used.

In addition, the first via conductor and the second via conductor may be bonded to each other at the small diameter portions, the multilayer substrate may further include a pattern conductor connected to the large diameter portion of the first via conductor or the large diameter portion of the second via conductor, and a width of the pattern conductor may be substantially equal (e.g., a difference of the width and the diameter is less than 10%) to a diameter of one, to which the pattern conductor is connected, of the large diameter portion of the first via conductor and the large diameter portion of the second via conductor.

It is possible to suppress not only loss in the column conductor but also the loss occurring in the connection portion between the pattern conductor and the column conductor by making the width of the pattern conductor substantially equal to the diameter of the large diameter portion in the column conductor in which the small diameter portions of the first via conductor and the second via conductor are bonded to each other. Thus, it is possible to suppress loss in a transmission line formed of the column conductor and the pattern conductor connected thereto.

Also, when viewed in the lamination direction, the first via conductor and the second via conductor may be arranged such that the center of one of the first via conductor and the second via conductor is positioned inside the other of the first via conductor and the second via conductor and the center of the other is positioned inside of the one.

By arranging the first via conductor and the second via conductor in this manner, it is possible to further reduce a step between the first via conductor and the second via conductor. Thus, loss in the column conductor can be further suppressed.

In addition, the column conductor may include three via conductors extending through three adjacent insulator layers, among the plurality of insulator layers, including the first via conductor and the second via conductor, and each of the three via conductors may have the tapered shape.

Thus, it is possible to suppress loss in the column conductor extending through the three insulator layers.

Further, the column conductor may include four or more via conductors extending through four or more adjacent insulator layers, among the plurality of insulator layers, including the first via conductor and the second via conductor. Each of the four or more via conductors may have the tapered shape, and the large diameter portions or the small diameter portions of adjacent via conductors may be bonded to each other among the four or more via conductors.

In this manner, each of the four or more via conductors has the tapered shape in which a cross section decreases from one end portion to the other end portion in the lamination direction of the plurality of insulator layers. Since the large diameter portions or the small diameter portions of adjacent via conductors among the four or more via conductors are bonded to each other, it is possible to further suppress loss in the column conductor, in which loss tends to be greater because the number of bonded portions of the via conductor is large. That is, loss can be effectively suppressed for the column conductor extending through many insulator layers.

Further, the column conductor may constitute a transmission line for transmitting a radio frequency signal.

The multilayer substrate as stated above is useful for a communication apparatus or the like in which high communication quality is required, because the deterioration of the radio frequency signal to be transmitted can be suppressed.

Further, an antenna module according to an aspect of the present disclosure includes any of the multilayer substrates described above, a patch antenna array provided on one main surface side of the multilayer substrate, and an RF signal processing circuit that is disposed on the other main surface side of the multilayer substrate. The RF signal processing circuit processes a transmission signal to be transmitted or a reception signal to be received by the patch antenna array.

It is possible to improve communication quality according to the above-mentioned antenna module, because loss associating with the column conductor is suppressed by including the multilayer substrate described above.

Further, the RF signal processing circuit may be arranged so as to overlap a region where the patch antenna array is arranged when viewed in the lamination direction, and the column conductor may constitute a feed line for transmitting the transmission signal or the reception signal.

In such an antenna module, since the RF signal processing circuit is arranged to overlap the region where the patch antenna array is arranged, the length of the pattern conductor constituting the feed line can be reduced, thereby suppressing loss in the feed line. Thus, in particular, such antenna module is useful as the antenna module for a millimeter wave band in which loss in the feed line easily affects the deterioration of communication quality.

According to the present disclosure, loss associating with a column conductor can be suppressed for a multilayer substrate and an antenna module.

DETAILED DESCRIPTION

Figure 1A:
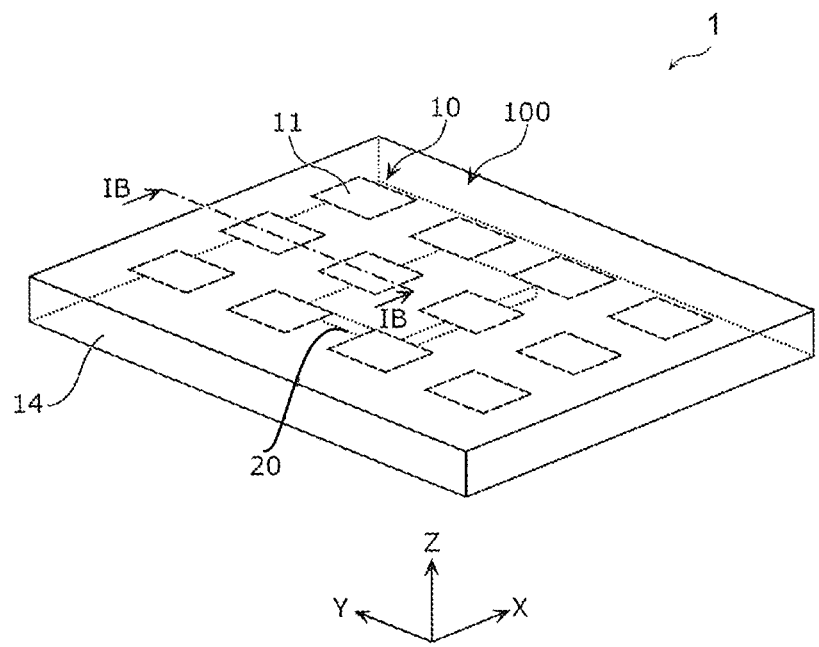
FIG. 1A is an external perspective view of an antenna module according to Embodiment 1.

Hereinafter, embodiments of the present disclosure will be described in detail with reference to the accompanying drawings. The embodiments described below are all inclusive or specific examples. The numerical values, shapes, materials, constituent elements, arrangement and connection forms of the constituent elements, and the like described in the following embodiments are simply examples, and are not intended to limit the present disclosure. Among the constituent elements in the following embodiments, constituent elements not described in the independent claims will be described as optional constituent elements. The sizes or size ratios of the constituent elements illustrated in the figure are not necessarily accurate. In addition, in the figures, the same reference numerals are used for the substantially same configurations, and a duplicated description may be omitted or simplified.

Embodiment 1

[1. Overall Configuration of Antenna Module]

FIG. 1A is an external perspective view of an antenna module 1 according to an embodiment 1.

Hereinafter, the thickness direction of the antenna module 1 will be described as a Z axis, directions perpendicular to the Z axis direction and orthogonal to each other are described as an X axis direction and a Y axis direction, respectively. The positive side of the Z axis will be described as a top surface side of the antenna module 1. However, in aspects of actual use, the top surface side of the antenna module 1 is not limited to an upward direction since the thickness direction of the antenna module 1 may not be an up-and-down direction.

The antenna module 1 illustrated in FIG. 1A includes an antenna array 100 constituted of a plurality of antenna elements 10 and an RFIC 20.

Each of the plurality of antenna elements 10 is a patch antenna having a radiation conductor 11 composed of a thin film pattern conductor provided parallel to the main surface of a multilayer substrate 14. The plurality of antenna elements 10 is regularly arranged to constitute the antenna array 100. That is, the antenna array 100 is a patch antenna array having the plurality of radiation conductors 11 regularly arranged on the multilayer substrate 14. A transmission signal or a reception signal is transmitted between the antenna array 100 and the RFIC 20, since each of the plurality of radiation conductors 11 is electrically connected to the RFIC 20 via a feed line which will be described later.

The number of the antenna elements 10 constituting the antenna array 100 may be two or more and is not limited to the description above. Further, the aspect of arrangement of the plurality of antenna elements 10 is not limited to the description above. For example, the antenna array 100 may be constituted by two or more antenna elements 10 arranged one-dimensionally, or may be constituted by three or more antenna elements 10 arranged in a staggered shape. Further, the antenna module 1 is not limited to a configuration including the antenna array 100 constituted by the plurality of antenna elements 10, and may include only one antenna element 10.

The RFIC 20 is provided on or in the multilayer substrate 14, and constitutes an RF signal processing circuit for processing signals of a transmission signal to be transmitted and a reception signal to be received by the antenna array 100. In the present embodiment, the RFIC 20 is arranged so as to overlap the arrangement region of the antenna array 100 when the multilayer substrate 14 is viewed in the lamination direction (when viewed in the Z axis direction).

Here, the arrangement region of the antenna array 100 is a minimum region including the plurality of radiation conductors 11 when the multilayer substrate 14 is viewed in the lamination direction, and is a region having a substantially rectangular shape in the present embodiment. When it is described that the RFIC 20 is positioned in the region of the antenna array 100, at least part of the RFIC 20 is positioned within the region of the antenna array 100, and specifically, the entire RFIC 20 is positioned within the region of the antenna array 100. The RFIC 20 is provided on the bottom surface of the multilayer substrate 14 in the present embodiment.

Note that the aspect of arrangement of the RFIC 20 is not limited to the above, and the RFIC 20 may be provided on the top surface of the multilayer substrate 14 at a position different from the position of the antenna array 100, for example. Further, the RF signal processing circuit is not limited to the RFIC 20, and may be constituted from a plurality of radio frequency circuit elements. For example, the RF signal processing circuit may be constituted of a phase shift circuit for adjusting a phase of a transmission signal to be transmitted or a reception signal to be received by the plurality of antenna elements 10, and an amplification circuit for amplifying the transmission signal or the reception signal. At least part of the RF signal processing circuit may be built-in in the multilayer substrate 14.

[2. Configuration of Multilayer Substrate]

Next, a detailed configuration of the multilayer substrate 14 in which the antenna array 100 is provided will be described.

Figure 1B:
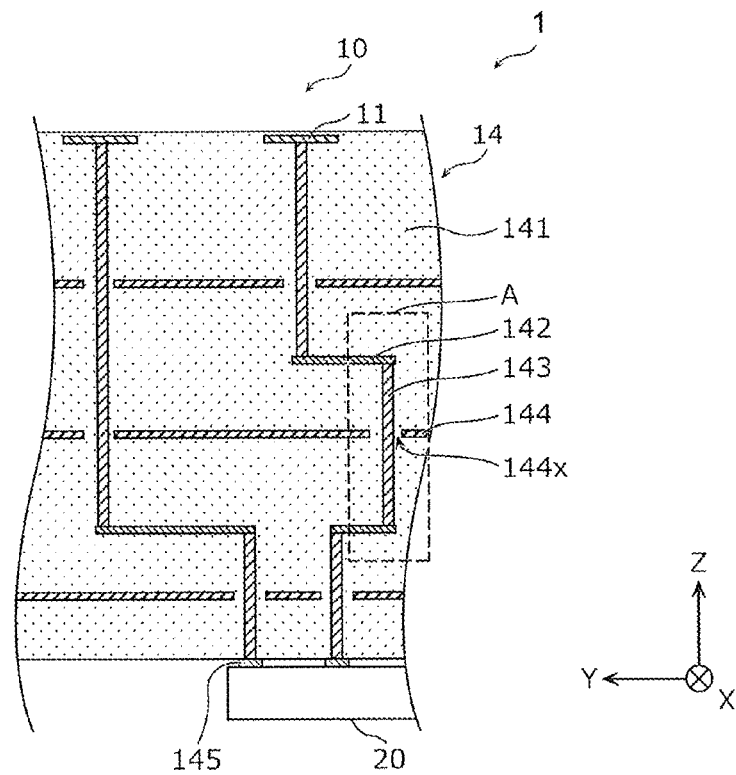
FIG. 1B is an enlarged sectional view of a part of the antenna module according to Embodiment 1.

FIG. 1B is an enlarged sectional view of part of the antenna module 1. Specifically, a section taken along line IB-IB in FIG. 1A is illustrated in FIG. 1B. Note that, in FIG. 1B, the constituting elements in other sections in the strict sense may be illustrated in the same figure, or the constituting elements in the same section may be omitted for simplicity. In addition, a column conductor for grounding that sets a ground conductor, which will be described later, to a ground potential may be provided to the multilayer substrate 14, but is omitted in the figures. The RFIC 20 is illustrated in a side view in FIG. 1B.

The multilayer substrate 14 is a substrate formed by laminating a plurality of insulator layers, and includes a substrate element 141 made of a dielectric material and various conductors provided in or on the substrate element 141. The substrate element 141 is formed of a plurality of laminated insulator layers. The various conductors include the radiation conductor 11 of the antenna element 10, a wiring conductor 142, a column conductor 143, a ground conductor 144, and a surface electrode 145 for mounting the RFIC 20. The radiation conductor 11, the wiring conductor 142, the ground conductor 144, and the surface electrode 145 are formed of a pattern conductor. The column conductor 143, on the other hand, is formed of two or more via conductors.

Here, the pattern conductor is a plate-like or a thin film-like conductor which is provided in a direction perpendicular to the lamination direction of the multilayer substrate 14, that is, in parallel with the main surface of the multilayer substrate 14. The via conductor, on the other hand, is a columnar conductor provided in the lamination direction of the multilayer substrate 14.

The radiation conductor 11 has a substantially rectangular shape when the multilayer substrate 14 is viewed in the lamination direction, and is provided in an inner layer near the top surface of the multilayer substrate 14 in the present embodiment. Note that the shape and aspect of arrangement of the radiation conductor 11 are not limited to those described above, and the radiation conductor 11 may have a substantially circular shape when the multilayer substrate 14 is viewed in the lamination direction, or may be exposed on the surface of the multilayer substrate 14. Further, the radiation conductor 11 is not limited to one pattern conductor, and may be formed of two pattern conductors, that is, a feed conductor and a non-feed conductor. The feed conductor is the pattern conductor connected to the feed line, and the non-feed conductor is the pattern conductor disposed above the feed conductor and is excited by the feed conductor.

The wiring conductor 142 and the column conductor 143 constitute the feed line. That is, the wiring conductor 142 and the column conductor 143 constitute a transmission line for transmitting a radio frequency signal. Note that, for example, when the multilayer substrate 14 is viewed in the lamination direction, in a case where the position of the feed point which is the point where the feed line is connected to the radiation conductor 11 and the position of the terminal which is connected to the feed line of the RFIC 20 overlap with each other, the feed line may be formed of only the column conductor 143.

The wiring conductors 142 are provided in two layers in the present embodiment, and the column conductor 143 connects the wiring conductors 142, the radiation conductor 11 of the antenna element 10, and the surface electrode 145. Note that the number of layers of the wiring conductor 142 is not limited to two, and may be one.

The column conductor 143 extends through two or more insulator layers out of the plurality of insulator layers constituting the substrate element 141. A detailed configuration of the column conductor 143 and the vicinity thereof will be described later. Note that the multilayer substrate 14 may be provided with not only the column conductor 143 extending through two or more insulator layers but also a column conductor extending through only one insulator layer.

A plurality of layers which are ground conductors 144 is disposed sandwiching the layer in which the wiring conductor 142 is provided, and is set to the ground potential. The ground conductor 144 is provided over substantially the entire multilayer substrate 14, for example, except the portion where the column conductor 143 is provided, when the multilayer substrate 14 is viewed in the lamination direction. In other words, the ground conductor 144 includes an opening 144x through which the column conductor 143 passes.

Three layers of the ground conductors 144 are provided in the present embodiment, and the ground conductor 144 provided closest to the radiation conductor 11 among the three layers of ground conductors serves as a ground conductor for the antenna element 10 that is a patch antenna. The number of layers of the ground conductor 144 is not limited to three, for example, two layers may be used when the number of layers of the wiring conductor 142 is one.

The surface electrode 145 is provided on the bottom surface of the multilayer substrate 14, and is connected to a terminal of the RFIC 20 with a conductive bonding material such as solder, for example, in between.

A low temperature co-fired ceramic (LTCC) substrate, a printed circuit board, or the like is used as the multilayer substrate 14. Al, Cu, Au, Ag, or a metal containing an alloy of those as a main component is used for the various conductors in the multilayer substrate 14.

[3. Configuration of Column Conductor and the Vicinity Thereof]

Next, the configuration of the column conductor 143 and the vicinity thereof will be described in detail with reference to the configuration illustrated in part A in FIG. 1B. The detailed description of the configuration of the column conductor 143 and the vicinity thereof in other portions will be omitted since they are similar to those illustrated in part A except that the insulator layer through which the column conductor 143 extends, the number thereof, and the pattern conductor to which the column conductor 143 is connected are different.

Figure 2A:
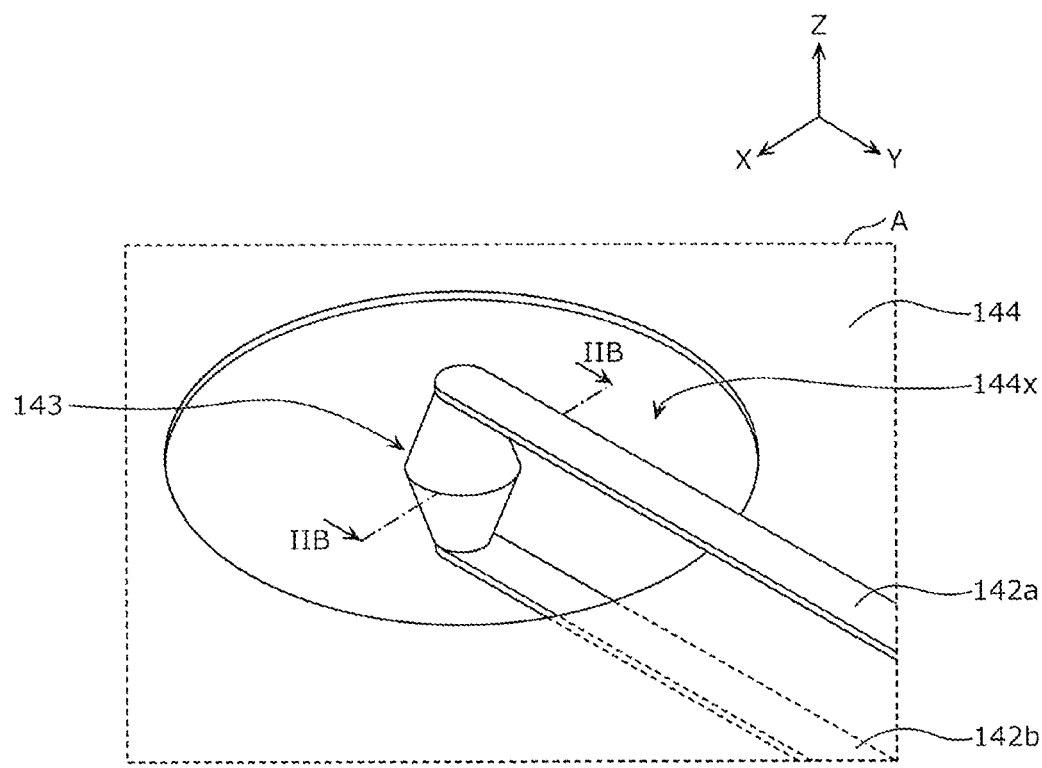
FIG. 2A is a perspective view of a column conductor and the vicinity thereof according to Embodiment 1.
Figure 2B:
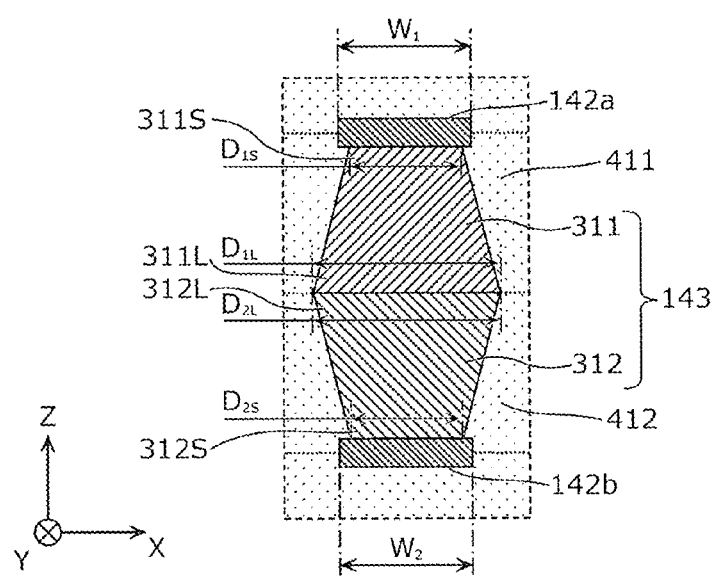
FIG. 2B is a sectional view of the column conductor and the vicinity thereof according to Embodiment 1.

FIG. 2A is a perspective view of the column conductor 143 and the vicinity thereof according to the present embodiment. Specifically, an enlarged view of part A in FIG. 1B is illustrated in FIG. 2A. FIG. 2B is a sectional view of the column conductor 143 and the vicinity thereof according to the present embodiment. Specifically, a section taken along line IIB-IIB in FIG. 2A is illustrated in FIG. 2B. The insulator layer is omitted in FIG. 2A for simplicity. The subsequent perspective views are illustrated in the same manner.

As is illustrated in the figures described above, the column conductor 143 in part A extends through two insulator layers 411 and 412 out of the plurality of insulator layers constituting the substrate element 141. Specifically, the column conductor 143 includes a via conductor 311 and a via conductor 312. The via conductor 311 is an example of a first via conductor extending through a first insulator layer, and extends through the insulator layer 411 which is an example of the first insulator layer. The via conductor 312 is an example of a second via conductor extending through a second insulator layer adjacent to the first insulator layer, and extends through the insulator layer 412 which is an example of the second insulator layer. The insulator layer 412 is positioned below the insulator layer 411. That is, the via conductor 312 is positioned below the via conductor 311.

Each of the via conductors 311 and 312 has a tapered shape in which a cross section decreases from one end portion to the other end portion in the lamination direction of the plurality of insulator layers. Specifically, the via conductor 311 has a reverse tapered shape in which a cross section increases from a top surface to a bottom surface. That is, the top surface of the via conductor 311 is a small diameter portion 311S which is an end portion having a small cross section, and the bottom surface of the via conductor 311 is a large diameter portion 311L which is an end portion having a large cross section. The via conductor 312, on the other hand, has a forward tapered shape in which a cross section decreases from the top surface to the bottom surface. That is, the top surface of the via conductor 312 is a large diameter portion 312L which is an end portion having a large cross section, and the bottom surface of the via conductor 312 is a small diameter portion 312S which is an end portion having a small cross section.

Each of the via conductors 311 and 312 has a truncated cone shape in the present embodiment. Specifically, the via conductor 311 has a truncated cone shape whose diameter of the small diameter portion 311S is $D_{1S}$, and the diameter of the large diameter portion 311L is $D_{1L}$ ($D_{1S}<D_{1L}$). The via conductor 312 has a tapered shape whose diameter of the small diameter portion 312S is $D_{2S}$, and the diameter of the large diameter portion 312L is $D_{2L}$ ($D_{2S}<D_{2L}$). In the via conductors 311 and 312, the diameters of the small diameter portions 311S and 312S are substantially equal (e.g., a difference of the diameters is less than 10%) to each other (that is, $D_{1S}=D_{2S}$), and the diameters of the large diameter portions 311L and 312L are substantially equal (e.g., a difference of the diameters is less than 10%) to each other (that is, $D_{1L}=D_{2L}$).

Note that the shapes of the via conductors 311 and 312 are not limited to those described above, and may have a truncated shape whose top and bottom surfaces are polygons such as the truncated pyramid. In such a via conductor, any diameter (for example, average diameter) between a maximum diameter and a minimum diameter of the surface of the large diameter portion may be used as the diameter of the large diameter portion. Any diameter (for example, average diameter) between the maximum diameter and the minimum diameter of the surface of the small diameter portion may be used as the diameter of the small diameter portion. In addition, the via conductor 311 and the via conductor 312 may be different from each other at least either in shape or size.

With respect to the via conductor 311 having the reverse tapered shape and the via conductor 312 having the forward tapered shape, the large diameter portion 311L and the large diameter portion 312L are directly bonded to each other. That is, the bottom surface of the via conductor 311 and the top surface of the via conductor 312 are directly bonded to each other without necessarily interposing the electrode pad or the like therebetween.

The small diameter portion 311S of the via conductor 311 or the small diameter portion 312S of the via conductor 312 is connected to the pattern conductor. For example, the width of the pattern conductor is smaller than the diameter of the large diameter portion of the via conductor that is one of the via conductors 311 and 312, to which the pattern conductor is connected.

Specifically, the small diameter portion 311S of the via conductor 311 is connected to a wiring conductor 142a which is an example of the wiring conductor 142 described above. For example, the line width $W_1$ of the wiring conductor 142a is smaller than the diameter $D_{1L}$ of the large diameter portion 311L of the via conductor 311 (that is, $W_1<D_{1L}$). Similarly, the small diameter portion 312S of the via conductor 312 is connected to a wiring conductor 142b which is another example of the wiring conductor 142 described above. For example, the line width $W_2$ of the wiring conductor 142b is smaller than the diameter $D_{2L}$ of the large diameter portion 312L of the via conductor 312 (that is, $W_2<D_{2L}$).

Note that the pattern conductor to which the via conductors 311 and 312 are connected is not limited to the wiring conductor 142 and may be, for example, the surface electrode 145.

[4. Configuration of Column Conductor and the Vicinity Thereof According to Another Configuration Example]

The via conductor 311 and the via conductor 312 may be arranged such that the small diameter portions 311S and 312S are bonded to each other.

Figure 3A:
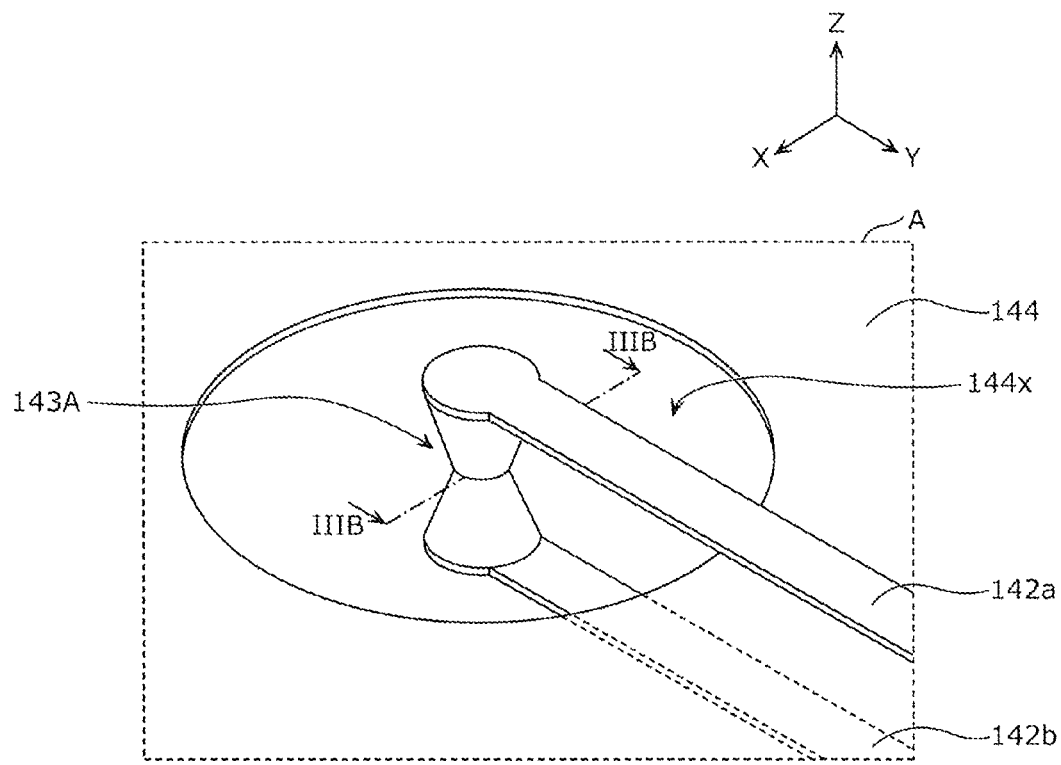
FIG. 3A is a perspective view of a column conductor and the vicinity thereof according to another configuration example of Embodiment 1.
Figure 3B:
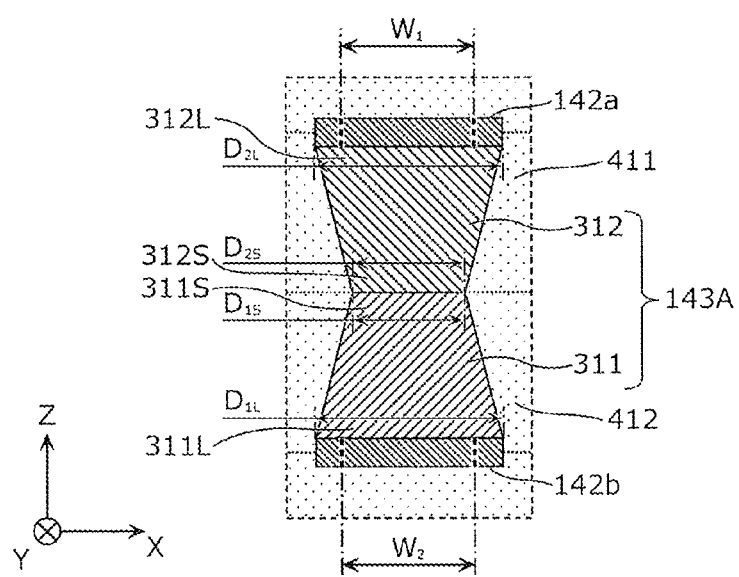
FIG. 3B is a sectional view of the column conductor and the vicinity thereof according to the other configuration example of Embodiment 1.

FIG. 3A is a perspective view of a column conductor 143A and the vicinity thereof according to another configuration example of the present embodiment. Specifically, an enlarged view of the portion corresponding to part A in FIG. 1B is illustrated in FIG. 3A. FIG. 3B is a sectional view of the column conductor 143A and the vicinity thereof according to another configuration example of the present embodiment. Specifically, a section taken along line IIIB-IIIB illustrated in FIG. 3A is illustrated in FIG. 3B.

As shown in the figures described above, the column conductor 143A is different from the column conductor 143 described above in that the small diameter portions 311S and 312S, which are end portions having a small cross section, are directly bonded to each other with respect to the via conductor 311 and the via conductor 312. Specifically, in the column conductor 143A, the aspect of arrangement of the via conductors 311 and 312 is reversed as compared with the column conductor 143 described above. In other words, in the present configuration example, the via conductor 312 is an example of the first via conductor extending through the first insulator layer, and extends through the insulator layer 411 which is an example of the first insulator layer. The via conductor 311 is an example of the second via conductor extending through the second insulator layer, and extends through the insulator layer 412 which is an example of the second insulator layer.

With respect to the via conductor 312 having the forward tapered shape and the via conductor 311 having the reverse tapered shape, the small diameter portion 311S and the small diameter portion 312S are directly bonded to each other. That is, the bottom surface of the via conductor 312 and the top surface of the via conductor 311 are directly bonded to each other without necessarily interposing the electrode pad or the like therebetween.

The large diameter portion 311L of the via conductor 311 or the large diameter portion 312L of the via conductor 312 are connected to the pattern conductor. For example, the width of the pattern conductor is smaller than the diameter of the large diameter portion of the via conductor that is one of the via conductors 311 and 312, to which the pattern conductor is connected.

Specifically, the large diameter portion 312L of the via conductor 312 is connected to the wiring conductor 142a which is an example of the wiring conductor 142 described above. For example, the line width $W_1$ of the wiring conductor 142a is smaller than the diameter $D_{2L}$ of the large diameter portion 312L of the via conductor 312 (that is, $W_1 < D_{2L}$). Similarly, the large diameter portion 311L of the via conductor 311 is connected to the wiring conductor 142b which is another example of the wiring conductor 142 described above. For example, the line width $W_2$ of the wiring conductor 142b is smaller than the diameter $D_{1L}$ of the large diameter portion 311L of the via conductor 311 (that is, $W_2 < D_{1L}$).

[5. Configuration of Column Conductor and the Vicinity Thereof According to Comparative Example]

The column conductor 143 and 143A configured as described above can suppress loss (that is, transmission loss) compared with a column conductor formed by bonding the plurality of via conductors each having the forward tapered shape.

Figure 4A:
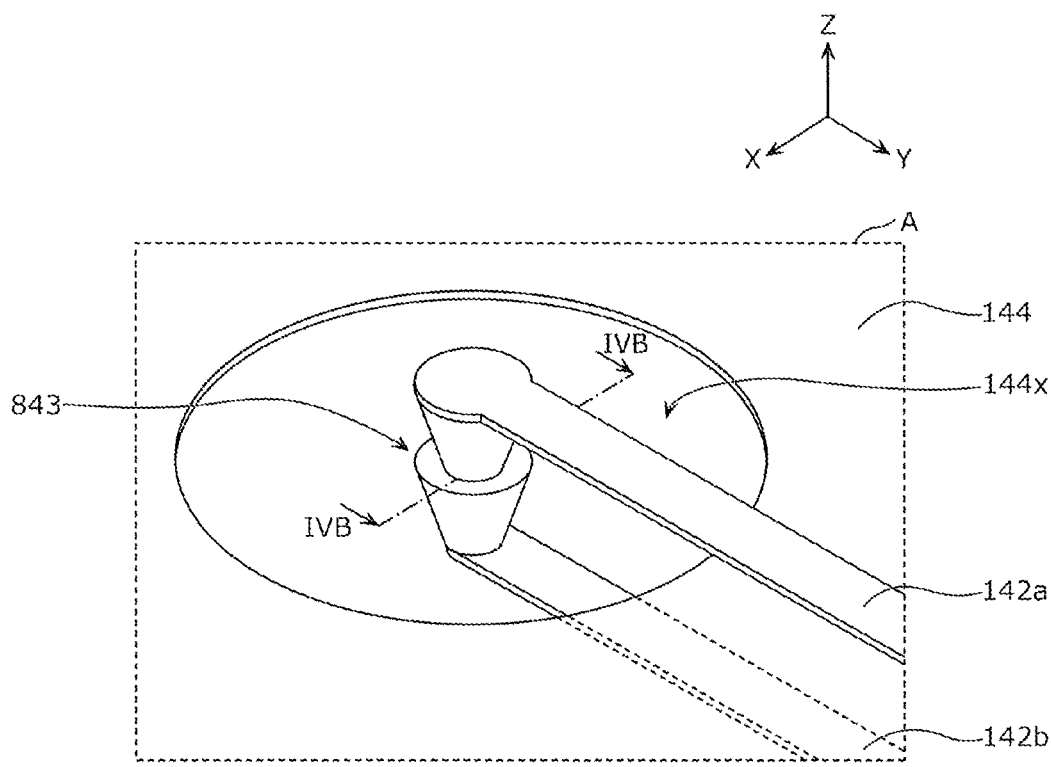
FIG. 4A is a perspective view of a column conductor and the vicinity thereof according to Comparative Example of Embodiment 1.
Figure 4B:
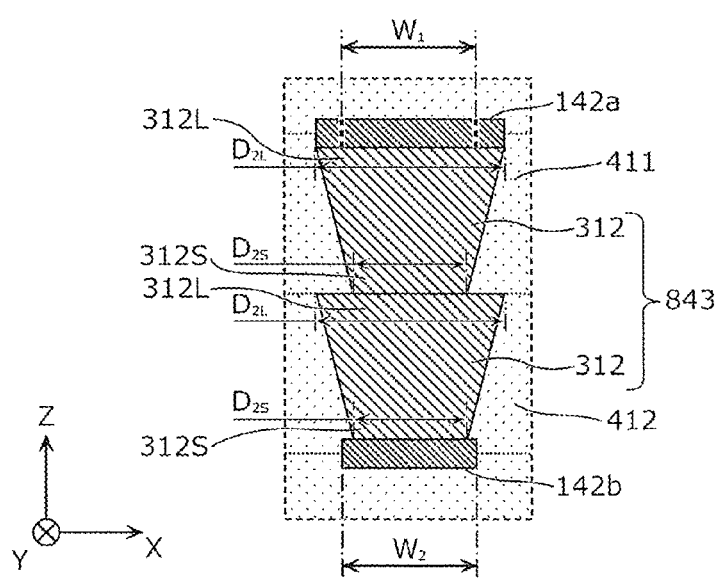
FIG. 4B is a sectional view of the column conductor and the vicinity thereof according to Comparative Example of Embodiment 1.

FIG. 4A is a perspective view of a column conductor 843 and the vicinity thereof according to Comparative Example of the present embodiment. Specifically, an enlarged view of the portion corresponding to part A in FIG. 1B is illustrated in FIG. 4A. FIG. 4B is a sectional view of the column conductor 843 and the vicinity thereof according to Comparative Example of the present embodiment. Specifically, a section taken along line IVB-IVB illustrated in FIG. 4A is illustrated in FIG. 4B.

As illustrated in the figures described above, the column conductor 843 is different from the column conductors 143 and 143A formed of the via conductor 311 having the reverse tapered shape and the via conductor 312 having the forward tapered shape in that the column conductor 843 is formed of only the via conductors 312 having the forward tapered shape. That is, in Comparative Example, the small diameter portion 312S and the large diameter portion 312L are bonded to each other in the adjacent via conductors 312.

[6. Comparison of Loss]

Next, the effects obtained by the column conductor 143 and the column conductor 143A will be described using the simulation model of the multilayer substrates in Examples 1 and 2 in comparison with Comparative Example. The multilayer substrates in Examples 1 and 2 respectively include the column conductor 143 and the column conductor 143A. The multilayer substrate in Comparative Example has the column conductor 843. Each simulation model has the same configuration except that the column conductors are different in configuration. Thus, the simulation model of the multilayer substrate in Example 1 will be described below, and the detailed description of other simulation models will be omitted.

Figure 5:
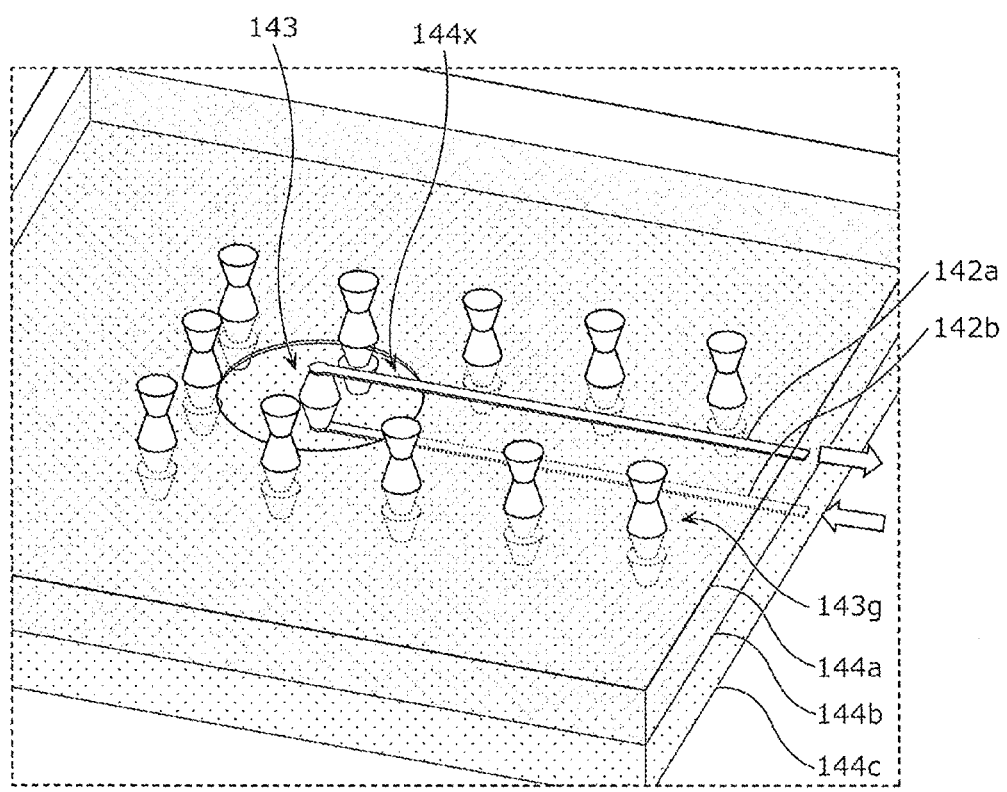
FIG. 5 is a perspective view illustrating a simulation model of Example 1.

FIG. 5 is a perspective view illustrating the simulation model of Example 1. Among the three layers of ground conductors 144a, 144b, and 144c which are an example of the ground conductor 144, the ground conductor 144a of the uppermost layer is illustrated only with the outer shape, and the ground conductor 144b of the inner layer and the ground conductor 144c of the lowermost layer are illustrated with dotted hatch, for simplicity.

The simulation model illustrated in the figure includes four insulator layers (not illustrated) sandwiched by the ground conductors 144a and 144c. The wiring conductor 142a connected to one end of the column conductor 143 is provided between the first insulator layer (uppermost layer) and the second insulator layer which are sandwiched by the ground conductors 144a and 144b. In the second insulator layer and the third insulator layer, provided is the column conductor 143 extending through the insulator layers. The wiring conductor 142b connected to the other end of the column conductor 143 is provided between the third insulator layer and the fourth insulator layer sandwiched by the ground conductors 144b and 144c. Further, in the four insulator layers, provided is a column conductor 143g for grounding that extends through the insulator layers and connects the ground conductors 144a, 144b and 144c to each other.

The dimensions of the simulation model are as follows.

Line width of wiring conductors 142a and 142b: 0.03 mm to 0.07 mm

Diameter of each via conductor: 0.08 mm at large diameter portion; 0.04 mm at small diameter portion Diameter of opening 144x (diameter of opening in GND): 0.2 mm Interval between the column conductors 143g for ground connection (GND Via pitch): 0.25 mm Height of each via conductor (Via height): 0.06 mm Thickness of each of wiring conductors 142a and 142b: 0.005 mm In this simulation model, a material having a dielectric constant (ε) of 3.4 to 6.4 and a dielectric tangent (tan σ) of 0.005 is used as the insulator layer. In addition, Cu having the conductivity of 58000000 S/m is used as the conductor.

Figure 6A:
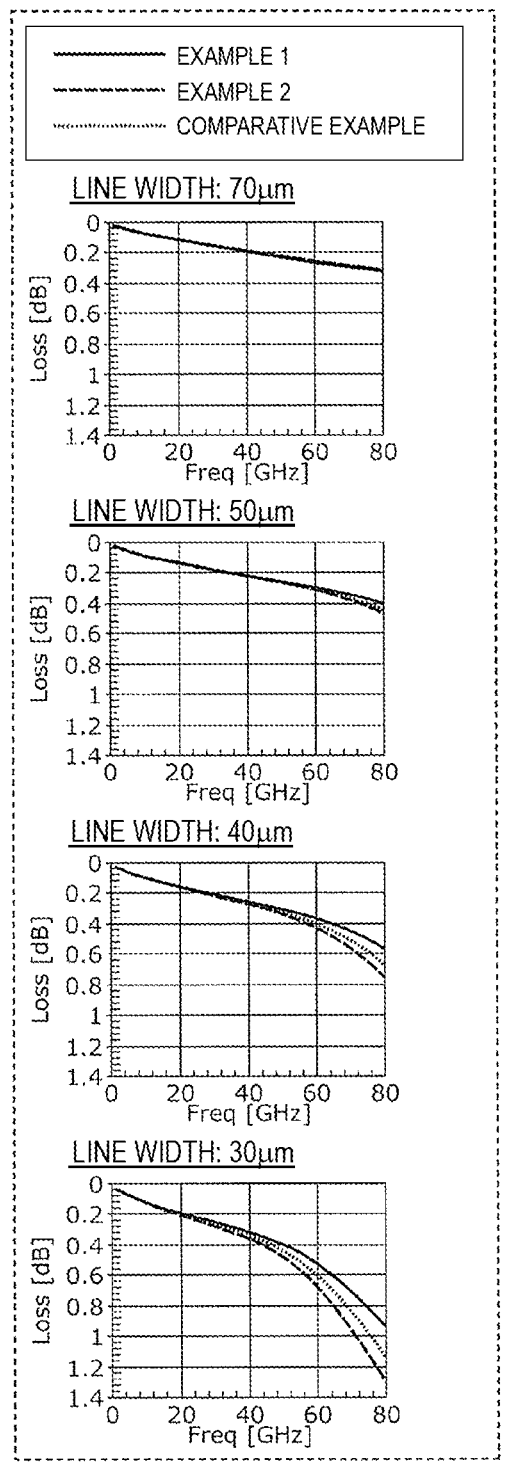
FIGS. 6AA, 6AB, 6AC, and 6AD are graphs describing simulation results of Examples 1 and 2 and Comparative Example.
Figure 6B:
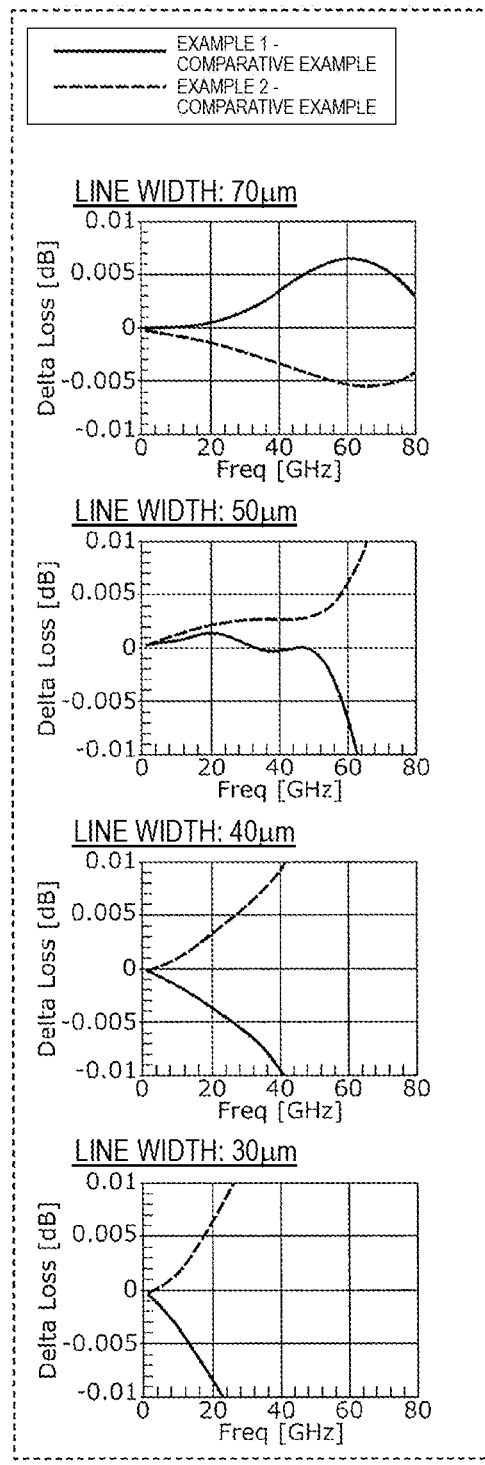
FIGS. 6BA, 6BB, 6BC, and 6BD are graphs describing simulation results of Examples 1 and 2 with reference to Comparative Example.

FIGS. 6AA, 6AB, 6AC, and 6AD are graphs describing the simulation results of Examples 1 and 2, and Comparative Example. Specifically, the ratio of the strength of the radio frequency signal transmitted to the end portion of the wiring conductor 142a to the strength of the radio frequency signal supplied to the end portion of the wiring conductor 142b is represented by an absolute value, when the line width of the wiring conductors 142a and 142b are set to 70 μm, 50 μm, 40 μm, and 30 μm. That is, the loss caused by the wiring conductor 142b, the column conductor, and the wiring conductor 142a which constitute the transmission path of the radio frequency signal is described in FIGS. 6AA, 6AB, 6AC, and 6AD. FIGS. 6BA, 6BB, 6BC, and 6BD are graphs describing the simulation results of Examples 1 and 2 with reference to Comparative Example. Specifically, in FIGS. 6BA, 6BB, 6BC, and 6BD, the difference obtained by subtracting the simulation result of Comparative Example from the simulation results of Examples 1 and 2 are described in FIGS. 6BA, 6BB, 6BC, and 6BD. That is, when the difference is negative, the loss is suppressed as compared with Comparative Example, and when the difference is positive, the loss is increased as compared with Comparative Example. Typical examples of specific numerical values of the difference described in FIGS. 6BA, 6BB, 6BC, and 6BD are listed in Table 1.

TABLE 1

|   |   | Line width of wiring conductor | | | |
|---|---|---|---|---|---|
|   |   | 70 μm | 50 μm | 40 μm | 30 μm |
| 1 GHz | Example 1 - Comparative Example | 0.0000 | 0.0003 | −0.0001 | −0.0003 |
|   | Example 2 - Comparative Example | −0.0002 | 0.0002 | −0.0001 | −0.0002 |
| 2.76 GHz | Example 1 - Comparative Example | 0.0000 | 0.0003 | −0.0004 | −0.0007 |
|   | Example 2 - Comparative Example | −0.0003 | 0.0004 | −0.0000 | 0.0000 |
| 3.11 GHz | Example 1 - Comparative Example | 0.0000 | 0.0004 | −0.0004 | −0.0008 |
|   | Example 2 - Comparative Example | −0.0003 | 0.0004 | 0.0000 | 0.0001 |
| 32.95 GHz | Example 1 - Comparative Example | 0.0021 | 0.0000 | −0.0069 | −0.0153 |
|   | Example 2 - Comparative Example | −0.0025 | 0.0027 | 0.0066 | 0.0150 |
| 33.13 GHz | Example 1 - Comparative Example | 0.0021 | −0.0000 | −0.0069 | −0.0154 |
|   | Example 2 - Comparative Example | −0.0025 | 0.0027 | 0.0067 | 0.0151 |
| 60 GHz | Example 1 - Comparative Example | 0.0065 | −0.0069 | −0.0346 | −0.0794 |
|   | Example 2 - Comparative Example | −0.0053 | 0.0061 | 0.0279 | 0.0743 |

As is apparent from the results described in FIGS. 6AA, 6AB, 6AC, 6AD, 6BA, 6BB, 6BC, 6BD, and Table 1, the loss relating to the column conductor is affected by the line width of the wiring conductors 142a and 142b connected to the column conductor, in addition to the configuration of the column conductor itself.

Specifically, (i) when the line width is substantially equal to the diameter of the large diameter portion of the via conductor (in this case, 80 μm), for example, when the line width is 70 μm, the loss is suppressed in Example 2. That is, in the case of (i) described above, the small diameter portions 311S and 312S of the via conductors 311 and 312 can be bonded to each other as in the column conductor 143A described above, and that the wiring conductors 142a and 142b can be connected to the large diameter portions 311L and 312L, respectively. Here, "substantially equal" includes not only completely equal but also approximately equal, and includes, for example, having a difference of about 15%, such as in 80 μm and 70 μm described above.

Further, (ii) when the line width is smaller than the diameter of the large diameter portion of the via conductor (in this case, 80 μm) and larger than the diameter of the small diameter portion (in this case, 40 μm), for example, when the line width is 50 μm, the loss is suppressed in Example 1 in the frequency band of higher than or equal to 33.13 GHz, and the loss is suppressed in Comparative Example in the frequency band of lower than or equal to 32.95 GHz. That is, when the frequency band used is higher than or equal to 33.13 GHz and in the case (ii) described above, the large diameter portions 311L and 312L of the via conductors 311 and 312 can be bonded to each other as the column conductor 143 described above, and that the wiring conductors 142a and 142b can be connected to the small diameter portions 311S and 312S, respectively.

Further, (iii) when the line width is smaller than or equal to the diameter of the small diameter portion of the via conductor (in this case, 40 μm), for example, when the line width is 40 μm or 30 μm, the loss is suppressed in Example 1. That is, in the case (iii) described above, the large diameter portions 311L and 312L of the via conductors 311 and 312 can be bonded to each other as the column conductor 143 described above, and the wiring conductors 142a and 142b can be connected to the small diameter portions 311S and 312S, respectively.

7. Summary

As described above, according to the multilayer substrate 14 of the present embodiment, each of the via conductors 311 and 312 has a tapered shape in which a cross section decreases from one end portion to the other end portion in the Z axis direction. The Z axis direction is the lamination direction of the plurality of insulator layers 411 and 412. With respect to the via conductors 311 and 312, the large diameter portions 311L and 312L or the small diameter portions 311S and 312S are directly bonded to each other, whereby the step formed between the via conductor 311 and the via conductor 312, which is the factor of loss in the column conductors 143 and 143A, can be reduced. Thus, it is possible to suppress the loss in the column conductor 143 and 143A.

Specifically, the current flowing through the conductor flows near the surface of the conductor as the frequency is higher, due to the skin effect. The signal loss caused when there is a step in the conductor becomes more marked as the frequency of the signal is higher. Therefore, in the column conductor 843 illustrated in FIGS. 4A and 4B, the loss tends to increase owing to the step in the bonded portion between the two via conductors 312, and in particular, the higher the frequency of the signal is, the larger the loss tends to be. On the other hand, in the column conductor 143 illustrated in FIGS. 2A and 2B and the column conductor 143A illustrated in FIGS. 3A and 3B, the step at the bonded portion of the two via conductors 311 and 312 can be reduced as compared with the column conductor 843, and the loss can thus be suppressed, and good effects can be achieved particularly when the frequency is high.

In addition, with respect to the column conductor 143 to which the large diameter portions 311L and 312L of the via conductors 311 and 312 are bonded, by making the line width (that is, width of pattern conductor) of the wiring conductor 142 smaller than the diameter of the large diameter portions 311L and 312L, not only the effect for the loss in the column conductor 143 but also the following effect is obtained. That is, in a relatively high frequency band of higher than or equal to 33.13 GHz, the loss occurring in the connection portion between the wiring conductor 142 and the column conductor 143 can also be suppressed. Therefore, when the frequency band used is higher than or equal to 33.13 GHz, the loss in the transmission line (feed line in the present embodiment) formed of the column conductor 143 and the wiring conductor 142 connected thereto can be suppressed.

The line width of the wiring conductor 142 may be larger than or equal to the diameter of the large diameter portions 311L and 312L of the column conductor 143. For example, the line width $W_1$ of the wiring conductor 142a may be larger than or equal to the diameter $D_{1L}$ of the large diameter portion of the via conductor 311 (that is, $W_1 \geq D_{1L}$).

Further, with respect to the column conductor 143 in which the large diameter portions 311L and 312L of the via conductors 311 and 312 are bonded to each other, by making the line width of the wiring conductor 142 smaller than the diameter of the small diameter portions 311S and 312S, it is possible to suppress the loss occurring in the connection portion between the wiring conductor 142 and the column conductor 143 even in a relatively low frequency band of lower than 33.13 GHz. Therefore, it is possible to suppress the loss in the transmission line formed of the column conductor 143 and the wiring conductor 142 connected thereto regardless of the frequency band to be used.

By setting 33.13 GHz as the threshold value, frequency band of higher than or equal to 33.13 GHz is taken as the relatively high frequency band and frequency band of lower than 33.13 GHz is taken as the relatively low frequency band. The threshold frequency, however, is only an example and may vary depending on the material of the elements constituting the antenna module 1 or the method of forming the antenna module 1. For example, the threshold value may be 20 GHz.

Therefore, with respect to the column conductor 143 in which the large diameter portions 311L and 312L of the via conductors 311 and 312 are bonded to each other, by making the line width of the wiring conductor 142 smaller than the diameter of the large diameter portions 311L and 312L, it is possible to suppress, as well as the loss in the column conductor 143, the loss occurring in the connection portion between the wiring conductor 142 and the column conductor 143 in the frequency band of higher than or equal to 20 GHz. Therefore, when the frequency band to be used is higher than or equal to 20 GHz, it is possible to suppress the loss in the transmission line formed of the column conductor 143 and the wiring conductor 142 connected thereto.

Further, with respect to the column conductor 143 in which the large diameter portions 311L and 312L of the via conductors 311 and 312 are bonded to each other, by making the line width of the wiring conductor 142 smaller than the diameter of the small diameter portions 311S and 312S, the loss occurring in the connection portion between the wiring conductor 142 and the column conductor 143 can be suppressed even in the frequency band lower than 20 GHz. Therefore, it is possible to suppress the loss in the transmission line formed of the column conductor 143 and the wiring conductor 142 connected thereto regardless of the frequency band to be used.

The line width of the wiring conductor 142 may be larger than the diameter of the small diameter portions 311S and 312S of the column conductor 143. For example, the line width $W_1$ of the wiring conductor 142a may be larger than the diameter $D_{1S}$ of the small diameter portion of the via conductor 311 (that is, $W_1 > D_{1S}$).

In addition, with respect to the column conductor 143A in which the small diameter portions 311S and 312S of the via conductors 311 and 312 are bonded to each other, by making the line width of the column conductor 142 substantially equal to the diameter of the large diameter portions 311L and 312L, it is possible to suppress not only the loss in the column conductor 143A but also the loss occurring in the connection portion between the wiring conductor 142 and the column conductor 143A. Thus, it is possible to suppress the loss in the transmission line formed of the column conductor 143A and the wiring conductor 142 connected thereto.

The line width of the wiring conductor 142 may be smaller than the diameter of the large diameter portions 311L and 312L of the column conductor 143A. For example, the line width $W_1$ of the wiring conductor 142a may be smaller than the diameter $D_{1L}$ of the large diameter portion of the via conductor 311 (that is, $W_1 < D_{1L}$).

The column conductors 143 and 143A constitute the transmission line for transmitting the radio frequency signal. The multilayer substrate 14 is useful for communication apparatus or the like which is required to have high communication quality, since the deterioration of the radio frequency signal to be transmitted can be suppressed.

The column conductors 143 and 143A are not limited to the transmission line described above, and may constitute, for example, the column conductor for grounding or the column conductor for power supply.

Further, according to the antenna module 1 of the present embodiment, the communication quality can be improved by providing the multilayer substrate 14, since the loss relating to the column conductors 143 and 143A is suppressed.

When the RFIC 20 is arranged to overlap the arrangement region of the antenna array 100, the length of the wiring conductor 142 constituting the feed line can be shortened, and the loss in the feed line can thus be suppressed. Therefore, the antenna module 1 according to the present embodiment is particularly useful as an antenna module in a millimeter wave band in which loss in the feed line easily affects deterioration in the communication quality.

8. Various Modified Examples of Column Conductor

The column conductors 143 and 143A may be different from the form described above because of the positional deviation in the manufacturing of the multilayer substrate 14, and the influence of materials and various restrictions through the manufacturing process of the multilayer substrate 14 or the like. Various modifications of the column conductors 143 and 143A described above will be described with reference to FIG. 7A to FIG. 11.

Figure 7A:
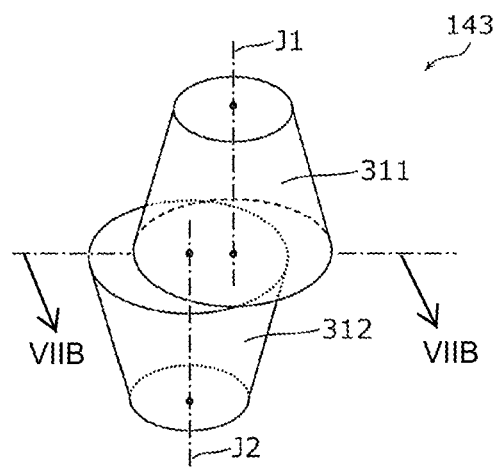
FIG. 7A is a perspective view of a first modification of the column conductor according to Embodiment 1.
Figure 7B:
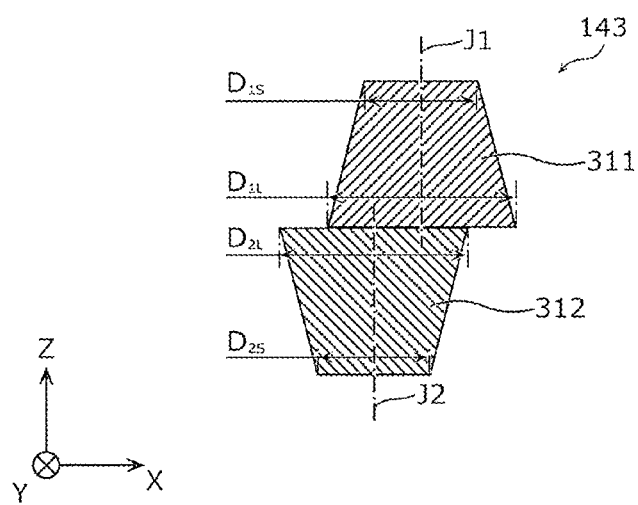
FIG. 7B is a sectional view of the first modification of the column conductor according to Embodiment 1.

FIG. 7A is a perspective view of a first modification of the column conductor 143 according to the present embodiment. FIG. 7B is a sectional view of the first modification. Specifically, a section taken along line VIIB-VIIB illustrated in FIG. 7A is illustrated in FIG. 7B.

As illustrated in the figures described above, the taper axis J1 of the via conductor 311 and the taper axis J2 of the via conductor 312 may or may not coincide with each other. That is, the status in which the via conductor 311 and the via conductor 312 are bonded to each other includes not only a case where the taper axis J1 and the taper axis J2 coincide with each other but also a case where the taper axis J1 and the taper axis J2 do not coincide with each other.

However, when the taper axis J1 and the taper axis J2 do not coincide with each other, the taper axis J1 can intersect the via conductor 312, and the taper axis J2 can intersect the via conductor 311. That is, when viewed in the lamination direction, the via conductor 311 and the via conductor 312 can be disposed such that the center of one via conductor is positioned inside the other via conductor and that the center of the other via conductor can be positioned within the one via conductor. By disposing the via conductor 311 and the via conductor 312 as described above, it is possible to further reduce the step between the via conductor 311 and the via conductor 312. Thus, the loss in the column conductor 143 can be further suppressed.

Figure 8A:
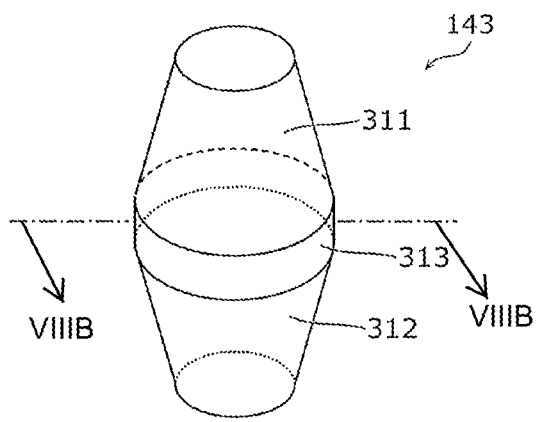
FIG. 8A is a perspective view of a second modification of the column conductor according to Embodiment 1.
Figure 8B:
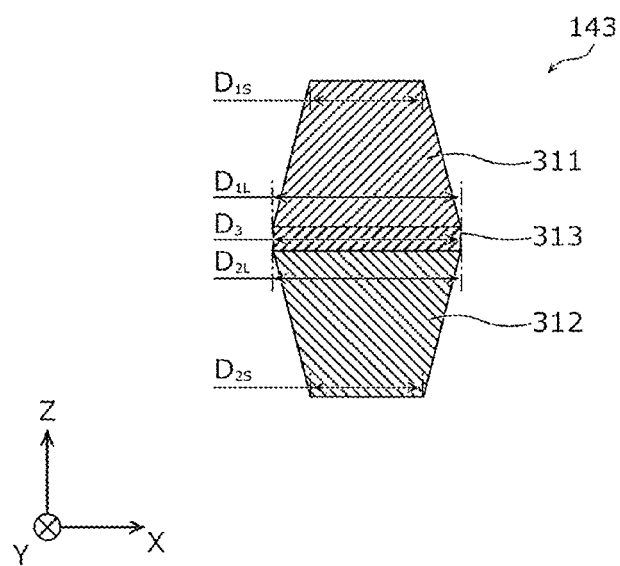
FIG. 8B is a sectional view of the second modification of the column conductor according to Embodiment 1.

In the above description, the via conductor 311 which is an example of the first via conductor and the via conductor 312 which is an example of the second via conductor are directly bonded to each other, however, the present disclosure is not limited thereto, and the via conductor 311 and the via conductor 312 may be bonded to each other with an electrode pad or the like interposed therebetween. FIG. 8A is a perspective view of a second modification of the column conductor 143 according to the present embodiment. FIG. 8B is a sectional view of the second modification. Specifically, a section taken along line VIIIB-VIIIB in FIG. 8A is illustrated in FIG. 8B.

As described in the figures described above, the column conductor 143 may include an electrode pad 313 in addition to the via conductor 311 and the via conductor 312. The electrode pad 313 is a pattern electrode provided between the insulator layer 411 which is an example of the first insulator layer (see FIG. 2B) and the insulator layer 412 which is an example of the second insulator layer (see FIG. 2B). The one main surface of the electrode pad 313 is bonded to the via conductor 311 and the other main surface of the electrode pad 313 is bonded to the via conductor 312.

When viewed in the lamination direction, the electrode pad 313 has a shape to be disposed inside at least one of the large diameter portion 311L of the via conductor 311 and the large diameter portion 312L of the via conductor 312. That is, when viewed in the lamination direction, the electrode pad 313 is disposed inside at least one of the large diameter portions by shifting or rotation. Here, when viewed in the lamination direction, the large diameter portions 311L and 312L have the same shape and the same size, and the electrode pad 313 has the same shape and the same size as those of the large diameter portions 311L and 312L. Specifically, when viewed in the lamination direction, the diameter $D_3$ of the electrode pad 313 is substantially equal to the diameter of the large diameter portions 311L and 312L (that is, $D_3=D_{1L}=D_{2L}$).

The shape of the electrode pad 313 is not limited to the shape described above, and may be a shape different from that of the large diameter portions 311L and 312L, for example, may be a substantially rectangular shape when viewed in the lamination direction.

Figure 9A:
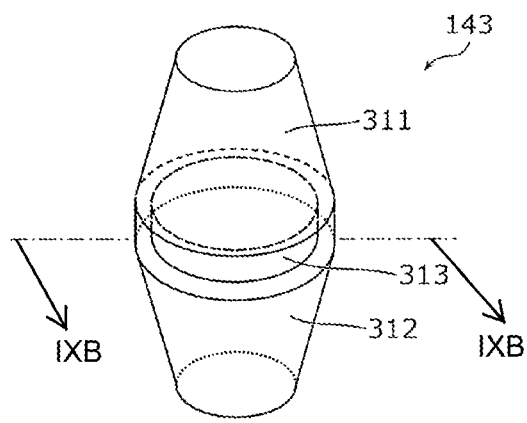
FIG. 9A is a perspective view of a third modification of the column conductor according to Embodiment 1.
Figure 9B:
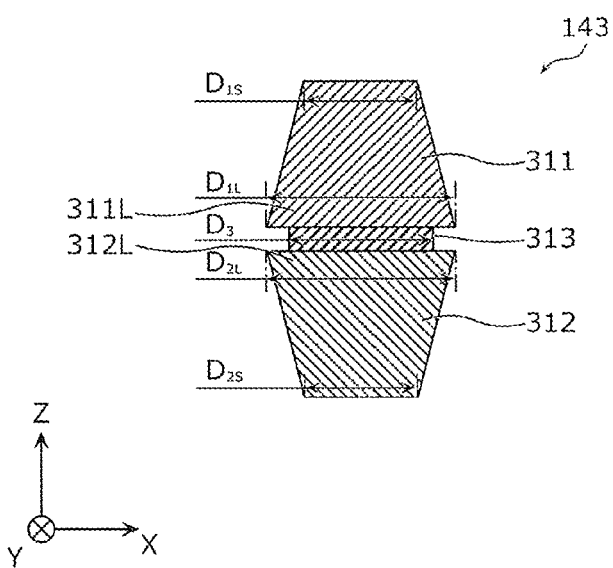
FIG. 9B is a sectional view of the third modification of the column conductor according to Embodiment 1.

The diameter $D_3$ of the electrode pad 313 may be smaller than the diameter of the large diameter portions 311L and 312L. FIG. 9A a is a perspective view of a third modification of the column conductor 143 according to the present embodiment. FIG. 9B is a sectional view of the third modification. Specifically, a section taken along line IXB-IXB in FIG. 9A is illustrated in FIG. 9B.

As illustrated in the figures described above, when viewed in the lamination direction, the large diameter portions 311L and 312L may have the same shape and the same size, and the electrode pad 313 may have the same shape as and smaller size than those of the large diameter portions 311L and 312L. However, when the size of the electrode pad 313 is too small, the loss in the column conductor 143 may increase. Therefore, the size of the electrode pad 313 may be determined as appropriate according to the requirements and the like for the multilayer substrate.

Figure 10A:
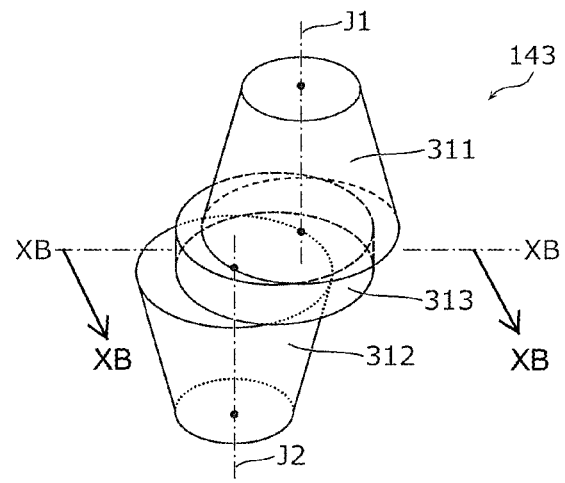
FIG. 10A is a perspective view of a fourth modification of the column conductor according to Embodiment 1.
Figure 10B:
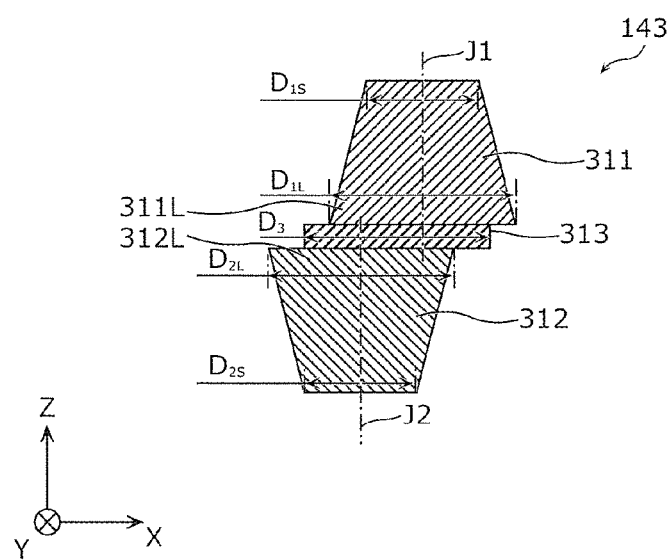
FIG. 10B is a sectional view of the fourth modification of the column conductor according to Embodiment 1.

FIG. 10A is a perspective view of a fourth modification of the column conductor 143 according to the present embodiment. FIG. 10B is a sectional view of the fourth modification. Specifically, a section taken along line XB-XB in FIG. 10A is illustrated in FIG. 10B.

As illustrated in the figures described above, the electrode pad 313 may have a shape to be disposed inside at least one of the large diameter portion 311L and the large diameter portion 312L when viewed in the lamination direction, and may be disposed shifting from the large diameter portion 311L and the large diameter portion 312L.

However, when the electrode pad 313 is disposed as described above, the electrode pad 313 can intersect the taper axis J1 of the via conductor 311 and the taper axis J2 of the via conductor 312 in order to suppress the loss in the column conductor 143. That is, when viewed in the lamination direction, the electrode pad 313 can be arranged so as to overlap the center of the via conductor 311 and the center of the via conductor 312.

The shape and size of the large diameter portion 311L and the shape and size of the large diameter portion 312L are not necessarily the same, and may be different from each other.

As modifications of the present embodiment, the first modification to the fourth modification of the column conductor 143 in which the large diameter portions 311L and 312L of the via conductors 311 and 312 are bonded to each other have been described. Matters described above can also be applied to the column conductor 143A in which the small diameter portions 311S and 312S of the via conductors 311 and 312 are bonded to each other.

Figure 11:
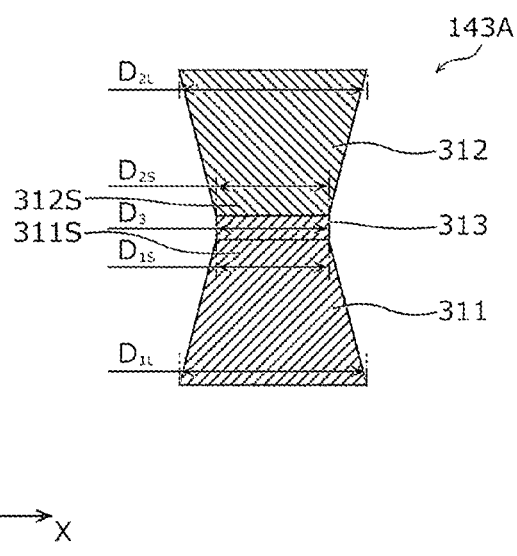
FIG. 11 is a sectional view of a fifth modification of the column conductor according to Embodiment 1.

Further, the column conductor 143A may be configured as illustrated in FIG. 11. FIG. 11 is a sectional view of a fifth modification of the column conductor according to the present embodiment (modification of column conductor 143A).

As illustrated in FIG. 11, with respect to the via conductors 311 and 312, when the small diameter portions 311S and 312S are bonded to each other, the electrode pad 313 can be arranged as follows. Specifically, when viewed in the lamination direction, the electrode pad 313 has the shape that is disposed inside at least one of the small diameter portion 311S of the via conductor 311 and the small diameter portion 312S of the via conductor 312. When the small diameter portions 311S and 312S are bonded to each other with the electrode pad 313 interposed therebetween, a protruding portion, which causes the loss in the portion where the small diameter portions 311S and 312S are bonded to each other, is not easily formed. Thus, the loss can be further suppressed in the column conductor 143A in which the small diameter portions 311S and 312S of the via conductors 311 and 312 are bonded to each other with the electrode pad 313 interposed therebetween.

In the column conductor 143A described above, the configuration of the electrode pad 313 is not limited to that described above. That is, the electrode pad 313 may have a shape that is larger than any of the small diameter portions 311S and 312S as long as the electrode pad 313 is disposed inside at least one of the large diameter portions 311L and 312L when viewed in the lamination direction.

Embodiment 2

The aspect of the column conductor formed of the via conductor having the tapered shape described in Embodiment 1 is not limited to the column conductor formed of two via conductors, but can also be applied to the column conductor formed of three or more via conductors. With respect to such column conductor, a description will be given of the multilayer substrate including the column conductor formed of four via conductors stacked in the present embodiment. The number of via conductors constituting the column conductor is equal to the number of insulator layers through which the column conductor extends.

Figure 12:
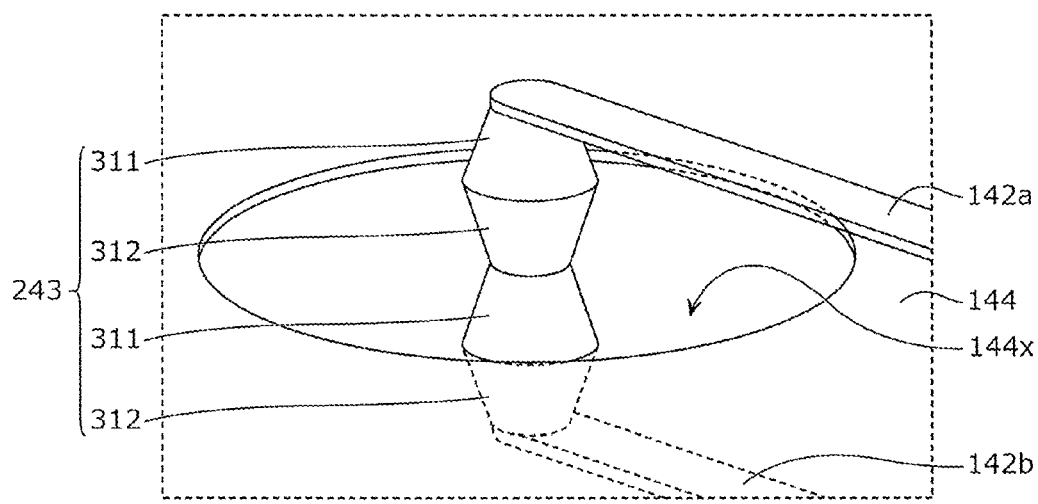
FIG. 12 is a perspective view of a column conductor and the vicinity thereof according to Embodiment 2.

FIG. 12 is a perspective view of a column conductor 243 and the vicinity thereof according to the present embodiment. Specifically, an enlarged view of the portion corresponding to part A in FIG. 1B is illustrated in FIG. 12. Although two insulator layers are provided between the two wiring conductors 142a and 142b in Embodiment 1, four insulator layers are provided in the present embodiment.

The column conductor 243 illustrated in FIG. 12 has four via conductors extending through four insulator layers (not shown). Specifically, in the column conductor 243, the via conductor 311, the via conductor 312, the via conductor 311, and the via conductor 312 are disposed in this order from the top. Hereinafter, each via conductor may be referred to as an n-th stage via conductor (n is natural number from 1 to 4) in ascending order from the top.

The large diameter portions or the small diameter portions of adjacent via conductors out of the four via conductors are bonded to each other. Specifically, the large diameter portions of the first stage via conductor 311 and the second stage via conductor 312 are bonded to each other. The small diameter portions of the second stage via conductor 312 and the third stage via conductor 311 are bonded to each other. The large diameter portions of the third stage via conductor 311 and the fourth stage via conductor 312 are bonded to each other. Further, the small diameter portion of the first stage via conductor 311 is connected to the wiring conductor 142a, and the small diameter portion of the fourth stage via conductor 312 is connected to the wiring conductor 142b.

Note that the column conductor formed of three or more via conductors are not limited to the configuration in which all adjacent via conductors are bonded to each other at large diameter portions or small diameter portions. In some adjacent via conductors, the large diameter portion and the small diameter portion may be bonded to each other.

Figure 13:
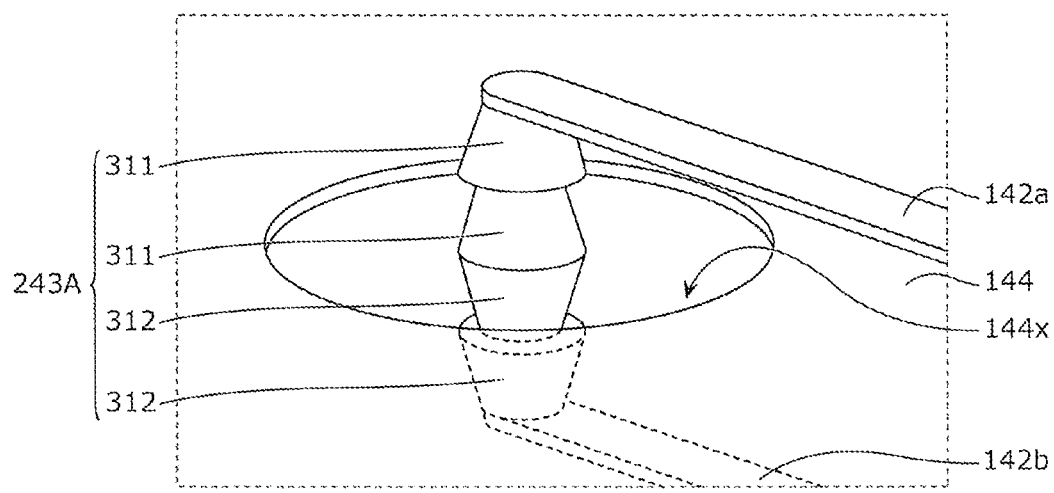
FIG. 13 is a perspective view of a column conductor and the vicinity thereof according to another configuration example of Embodiment 2.

FIG. 13 is a perspective view of a column conductor 243A and the vicinity thereof according to another configuration example of the present embodiment.

In the column conductor 243A illustrated in FIG. 13, two via conductors 311 and two via conductors 312 are disposed in this order from the top. That is, the column conductor 243A is different from the column conductor 243 in the configuration of the via conductors in the second stage and the third stage. The large diameter portion of the first stage via conductor 311 and the small diameter portion of the second stage via conductor 311 are bonded to each other. The large diameter portions of the second stage via conductor 311 and the third stage via conductor 312 are bonded to each other. The small diameter portion of the third stage via conductor 312 and the large diameter portion of the fourth stage via conductor 312 are bonded to each other.

The multilayer substrate including the column conductors 243 and 243A configured as described above can suppress the loss as compared with the multilayer substrate including the column conductors constituted by bonding the plurality of via conductors each having the forward tapered shape.

Figure 14:
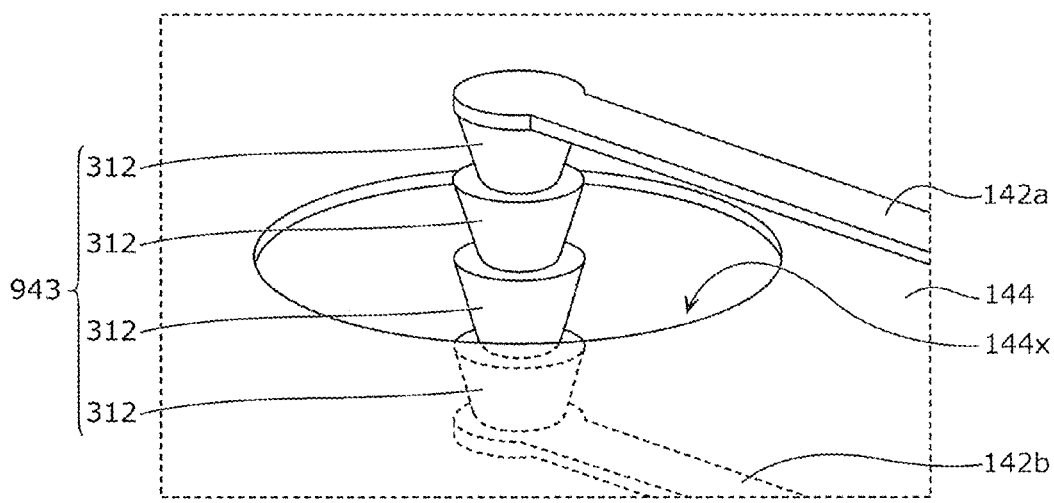
FIG. 14 is a perspective view of a column conductor and the vicinity thereof according to Comparative Example of Embodiment 2.

FIG. 14 is a perspective view of a column conductor 943 and the vicinity thereof according to Comparative Example of the present embodiment.

The column conductor 943 illustrated in FIG. 14 is different from the column conductors 243 and 243A constituted of the via conductor 311 having the reverse tapered shape and the via conductor 312 having the forward tapered shape in that the column conductor 943 is constituted only of the via conductors 312 having the forward tapered shape. In Comparative Example, the large diameter portion and the small diameter portion are bonded to each other in all adjacent via conductors.

Next, effects obtained when the column conductors 243 and 243A are used will be described with reference to Examples 3 and 4 as compared with Comparative Example. The multilayer substrates in Examples 3 and 4 respectively include the column conductor 243 and the column conductor 243A. The multilayer substrate in Comparative Example has the column conductor 943.

Figure 15:
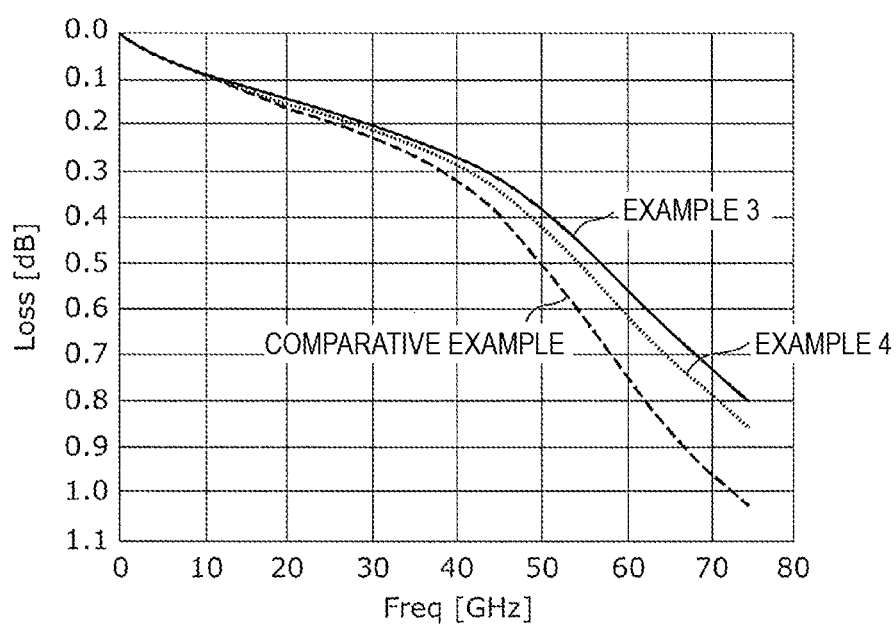
FIG. 15 is a graph describing simulation results of Examples 3 and 4 and Comparative Example.

FIG. 15 is a graph describing the simulation results of Examples 3 and 4 and Comparative Example. The simulation model used is the same as the simulation model used in Embodiment 1, except for the following points.

Line width of wiring conductors 142a and 142b: 0.03 mm
Height of each via conductor (Via height): 0.03 mm
Dielectric constant ($\varepsilon$) of the insulator layer: 6.4

As is apparent from the results described in FIG. 15, in Examples 3 and 4, the loss is suppressed at any frequency as compared with Comparative Example. Further, it is found that the loss is more suppressed in Example 3 than in Example 4.

As described above, according to the multilayer substrate of the present embodiment, each of the four or more via conductors (four via conductors formed of two via conductors 311 and two via conductors 312 in the present embodiment) has the tapered shape in which the cross section decreases from one end portion to the other end portion in the lamination direction of the plurality of insulator layers. Of the adjacent via conductors out of the four or more via conductors, the large diameter portions or small diameter portions are bonded to each other, whereby the loss can be suppressed further in the column conductor 243 in which the loss tends to increase owing to a large number of bonded portions of the via conductors. In other words, the loss can be effectively suppressed for the column conductor 243 extending through many insulator layers.

Other Embodiments

Although the multilayer substrate and the antenna module according to the embodiment of the present disclosure have been described above, the present disclosure is not limited to the individual embodiments. Within the scope of the present disclosure, those obtained by applying various modifications that can be conceived by those skilled in the art to the present embodiments and the modifications, different embodiments, and embodiments configured by combining constituting elements in the modification thereof may be included in the scope of one or a plurality of aspects of the present disclosure.

For example, the multilayer substrate described above is not limited to the antenna module, and may be used, for example, in the substrate of an RF front-end circuit or a communication device. The multilayer substrate is particularly useful as the substrate used for radio frequency applications since it is possible to suppress the loss associated with the column conductor.

Figure 16:
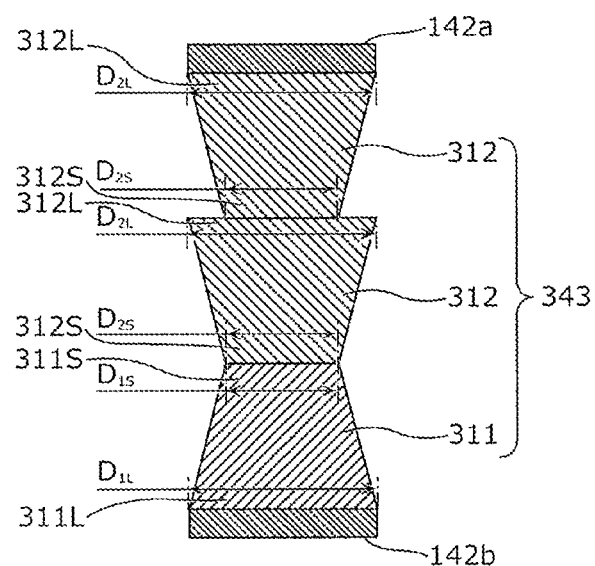
FIG. 16 is a sectional view of a column conductor in another embodiment.

The column conductor is not limited to those described above, and may be formed of three via conductors each having the tapered shape, for example. FIG. 16 is a sectional view of a column conductor 343 formed as described above. The wiring conductors 142a and 142b connected to the column conductor 343 are also illustrated in FIG. 16. As illustrated in FIG. 16, the column conductor 343 has three via conductors including the via conductor 311 which is an example of the first via conductor and the via conductor 312 which is an example of the second via conductor, and extends through the three adjacent insulator layers (not shown). Specifically, in the column conductor 343, the via conductor 312, the via conductor 312, and the via conductor 311 are disposed in this order from the top. The small diameter portion 312S of the second stage via conductor 312 and the small diameter portion 311S of the third stage via conductor 311 are bonded to each other. Thus, the loss can be suppressed in the column conductor 343 extending through the three insulator layers.

Note that the configuration of the column conductor formed of the three via conductors is not limited thereto. For example, the column conductor may be formed of two via conductors of which large diameter portions are bonded to each other, and one other via conductor connected thereto.

In the present disclosure, various dimensional values such as the thickness of each layer, the shape, the position and the size of conductors in the multilayer substrate are not particularly limited. Further, there are no particular limitations on the compounds of the materials constituting each layer of the multilayer substrate and the compounding ratio thereof, compounds of the materials used for the conductors in the multilayer substrate and the like, and the compounding ratios thereof, and physical properties such as conductivity. These values are appropriately determined in consideration of circuit characteristics such as radio frequency characteristics required for the circuit (for example, transmission circuit) formed with the multilayer substrate.

INDUSTRIAL APPLICABILITY

The present disclosure is widely applicable to a communication device such as a cellular phone as the multilayer substrate for the antenna module, or the like.

REFERENCE SIGNS LIST

1 ANTENNA MODULE
10 ANTENNA ELEMENT
11 RADIATION CONDUCTOR
14 MULTILAYER SUBSTRATE
20 RFIC
141 SUBSTRATE ELEMENT
142, 142a, 142b WIRING CONDUCTOR
143, 143A, 143g, 243, 243A, 343, 843 and 943 COLUMN CONDUCTOR
144, 144a, 144b, 144c GROUND CONDUCTOR
144x OPENING
145 SURFACE ELECTRODE
311, 312 VIA CONDUCTOR
311S, 312S SMALL DIAMETER PORTION
311L, 312L LARGE DIAMETER PORTION
313 ELECTRODE PAD
411, 412 INSULATOR LAYER

The invention claimed is:

1. A multilayer substrate, comprising: a plurality of insulator layers laminated; and a column conductor extending through two or more of the plurality of insulator layers, wherein the column conductor includes a first via conductor extending through a first insulator layer, a second via conductor extending through a second insulator layer adjacent to the first insulator layer, each of the first via conductor and the second via conductor has a tapered shape in which a cross section decreases from one end portion to another end portion in a lamination direction of the plurality of insulator layers, and the first via conductor and the second via conductor are directly bonded to each other at large diameter portions that are end portions with a large cross section, the multilayer substrate further includes a pattern conductor connected to a small diameter portion of the first via conductor or a small diameter portion of the second via conductor, and a width of the pattern conductor is smaller than a diameter of one, to which the pattern conductor is connected, of the large diameter portion of the first via conductor and the large diameter portion of the second via conductor, and wherein the width of the pattern conductor is smaller than or equal to a diameter of one, to which the pattern conductor is connected, of the small diameter portion of the first via conductor and the small diameter portion of the second via conductor.

2. The multilayer substrate according to claim 1, wherein the first via conductor and the second via conductor are arranged such that a center of the diameter of one of the first via conductor and the second via conductor at which the first via conductor and the second via conductor are connected is positioned inside the diameter of the other of the first via conductor and the second via conductor, and a center of the diameter of the other is positioned inside the diameter of the one of the first via conductor and the second via conductor when viewed in the lamination direction.

3. The multilayer substrate according to claim 1, wherein the column conductor includes three via conductors extending through three adjacent insulator layers, among the plurality of insulator layers, including the first via conductor and the second via conductor, and each of the three via conductors has the tapered shape.

4. The multilayer substrate according to claim 1, wherein the column conductor includes four or more via conductors extending through four or more adjacent insulator layers, among the plurality of insulator layers, including the first via conductor and the second via conductor, each of the four or more via conductors has the tapered shape, and the large diameter portions or the small diameter portions of adjacent via conductors are bonded to each other among the four or more via conductors.

5. The multilayer substrate according to claim 1, wherein the column conductor constitutes a transmission line for transmitting a radio frequency signal.

6. An antenna module comprising: the multilayer substrate according to claim 1; a patch antenna array provided on one main surface side of the multilayer substrate; and an RF signal processing circuit that is provided on another main surface side of the multilayer substrate and that processes a transmission signal to be transmitted or a reception signal to be received by the patch antenna array.

7. The antenna module according to claim 6, wherein the RF signal processing circuit is arranged so as to overlap a region where the patch antenna array is arranged when viewed in the lamination direction, and the column conductor constitutes a feed line for transmitting the transmission signal or the reception signal.

8. A multilayer substrate, comprising: a plurality of insulator layers laminated; and a column conductor extending through two or more of the plurality of insulator layers, wherein the column conductor includes a first via conductor extending through a first insulator layer, a second via conductor extending through a second insulator layer adjacent to the first insulator layer, and an electrode pad which is disposed between the first insulator layer and the second insulator layer, and one main surface of the electrode pad is bonded to the first via conductor and another main surface of the electrode pad is bonded to the second via conductor, each of the first via conductor and the second via conductor has a tapered shape in which a cross section decreases from one end portion to another end portion in a lamination direction of the plurality of insulator layers, the first via conductor and the second via conductor are bonded, with the electrode pad interposed in between, to each other at large diameter portions that are end portions with a large cross section, and the electrode pad has a shape configured to be disposed in at least one of the large diameter portion of the first via conductor and the large diameter portion of the second via conductor when viewed in the lamination direction, the multilayer substrate further includes a pattern conductor connected to a small diameter portion of the first via conductor or a small diameter portion of the second via conductor, and a width of the pattern conductor is smaller than a diameter of one, to which the pattern conductor is connected, of the large diameter portion of the first via conductor and the large diameter portion of the second via conductor, and wherein the width of the pattern conductor is smaller than or equal to a diameter of one, to which the pattern conductor is connected, of the small diameter portion of the first via conductor and the small diameter portion of the second via conductor.

9. The multilayer substrate according to claim 8, wherein the first via conductor and the second via conductor are arranged such that a center of the diameter of one of the first via conductor and the second via conductor at which the first via conductor and the second via conductor are connected is positioned inside the diameter of the other of the first via conductor and the second via conductor, and a center of the diameter of the other is positioned inside the diameter of the one of the first via conductor and the second via conductor when viewed in the lamination direction.

\* \* \* \* \*